United States Patent
Sung et al.

(10) Patent No.: US 6,380,090 B1
(45) Date of Patent: Apr. 30, 2002

(54) PROTECTING METHOD APPLIED TO THE SEMICONDUCTOR MANUFACTURING PROCESS

(75) Inventors: Mei-Hui Sung; Shih-Kuan Tai, both of Hsinchu (TW)

(73) Assignee: Winbond Electrinics Corp, Hsinchu (TW)

( * ) Notice: Subject to any disclaimer, the term of this patent is extended or adjusted under 35 U.S.C. 154(b) by 0 days.

(21) Appl. No.: 09/174,143

(22) Filed: Oct. 16, 1998

(30) Foreign Application Priority Data

May 29, 1998 (TW) .......................................... 87108488

(51) Int. Cl.⁷ .......................................... H01L 21/3065
(52) U.S. Cl. ....................... 438/706; 438/710; 438/712; 438/716
(58) Field of Search ................................ 438/706, 710, 438/715, 719, 725; 427/237, 230; 118/719, 722; 156/345; 134/1.3, 1.2

(56) References Cited

U.S. PATENT DOCUMENTS

| | | | | |
|---|---|---|---|---|
| 5,089,084 A | * | 2/1992 | Chhabra et al. | 156/345 |
| 5,380,682 A | * | 1/1995 | Edward et al. | 438/800 |
| 5,863,602 A | * | 1/1999 | Watanabe et al. | 427/237 |
| 6,098,304 A | * | 8/2000 | Manjkow et al. | 34/79 |

* cited by examiner

Primary Examiner—Felisa Hiteshew
Assistant Examiner—Lan Vinh
(74) Attorney, Agent, or Firm—Dike, Bronstein, Roberts & Cushman; David G. Conlin; David A. Tucker

(57) ABSTRACT

A method and a structure for protecting a work piece in a semiconductor manufacturing process includes a cassette for mounting therein the work pieces and a sheet piece for shielding the work pieces; and a working platform for mounting thereon said cassette. Furthermore, there is a lid covering the working platform in order to prevent a contaminant from entering the cassette during the semiconductor manufacturing process so that the gate oxide loss of every wafer in the cassette will be reduced.

8 Claims, 7 Drawing Sheets

PROTECTING METHOD APPLIED TO THE SEMICONDUCTOR MANUFACTURING PROCESS

FIELD OF THE INVENTION

The present invention relates to a method and a structure for protecting a work piece in a semiconductor manufacturing process, and more particularly to a method and a structure for protecting a wafer in an etching process.

BACKGROUND OF THE INVENTION

In a semiconductor manufacturing process, gaseous hydrofluoric acid (HF vapor) is usually used for removing the remaining polymer on a silicon surface after a reactive ion etching (RIE) process. However, it can also etch away the underlying oxide layer which is deposited for protecting the silicon surface from being damaged in the subsequent implantation, and affect the yield rate of the wafers.

There are many kinds of electronic circuits distributed on a silicon surface in an electric device. Take a transistor for example, an oxide layer (12) is formed on the silicon surface (16) as shown in FIG. 1. After executing a RIE process, a polymeric residue (15) may be remained on the top and the edge of the oxide layer (12). The HF vapor (17) is used to remove this polymeric residue (15).

Referring to FIG. 2, the wafers are collected in a cassette (11). This cassette has 25 slots wherein 24 wafers are mounted thereon from the slot 1 to the slot 24 respectively, but nothing is mounted in the slot 25.

The cassette (11) is placed on an etching machine (21) when applying the HF vapor to remove the polymeric residue as shown in FIG. 3. The etching machine (21) is a single-wafer processing machine. Two areas are located on the working platform of the etching machine, one is a loader area (22) and the other is an unloader area (23). The cassette (11) having 24 wafers is placed on the loader area (22). The etching machine 21 picks a wafer from the cassette on the loader area at a time and then transfer the processed wafer to the unloader area until 24 wafers are processed.

Please refer to FIG. 4, which is a curve illustrating the gate oxide loss of the wafer where the x-axis specifies the number of the slots and the y-axis specifies the gate oxide loss of the wafer. According to these experimental data, the gate oxide loss of the wafer from slot 1 to slot 23 are not to much, but the oxide loss of the wafer in slot 24 has been increased dramatically. The increased oxide loss means that the oxide layer on a silicon surface becomes much thinner which will influence the following steps of the manufacturing process, for example, the silicon surface will be damaged when executing an ion implantation, thereby reducing the device relability.

SUMMARY OF THE INVENTION

Therefore, a major object of the present invention is to provide a process which can improve the problem of large gate oxide loss of the wafer, and avoid bad influence in the following processes.

Another object of the present invention is to provide a process which can improve the yield rate of the wafer in order to improve the quality of these semiconductor devices.

The present invention provides a method for protecting a wafer in an etching process. The method includes steps of providing a cassette for mounting therein the wafers, and providing a sheet piece for shielding the wafers in the cassette.

There are 25 slots for respectively mounting wafers and the sheet piece in this cassette. 24 wafers are mounted from slot 1 to slot 24 of the 25 slots and a sheet piece is mounted in slot 25. This sheet piece is a dummy wafer.

According to the present invention, the etching process is a gaseous hydrofluoric acid etching process for removing the polymeric residue on the silicon surface of the wafer. The etching process is carried out on an etching working platform mounted on an etching machine and is to etch a wafer in the slot 1 first. The etching process is finished after the wafer in the slot 24 is etched.

The working platform has a lid covering the working platform in order to prevent a contaminant, e.g. moisture, from entering the cassette on the working platform. The etching machine is a single-wafer processing machine which etches one wafer at a time.

The present invention may best be understood through the following description with reference to the accompanying drawings, in which:

DETAILED DESCRIPTION OF THE PREFERRED EMBODIMENTS

The wafer in the slot 24 is on the top of the cassette. Because the time of the etching process is very long, the wafer on the top of the cassette is exposed in the air for a long time. Due to the chemistry of the moisture, the etch rate of oxide by HF vapor is enhanced, resulting in that the gate oxide loss of the wafer is more serious than other wafers after performing the etching process.

Figure 5:
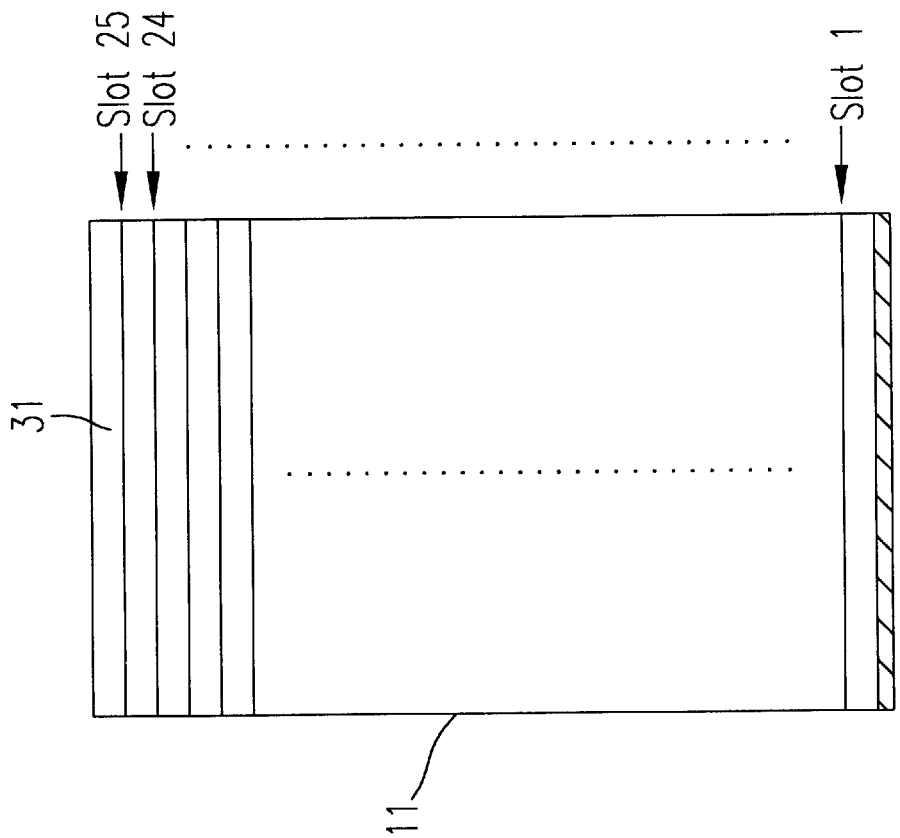
FIG. 5 is a schematic diagram showing a cassette with a sheet piece and 24 wafers according to the present invention.

As shown in FIG. 5, a sheet piece (31) for shielding the wafers is mounted in slot 25 of the cassette (11). For the convenience, the sheet piece can be a dummy wafer. The sheet piece can prevent the wafer from being contaminated with the moisture.

Figure 6:
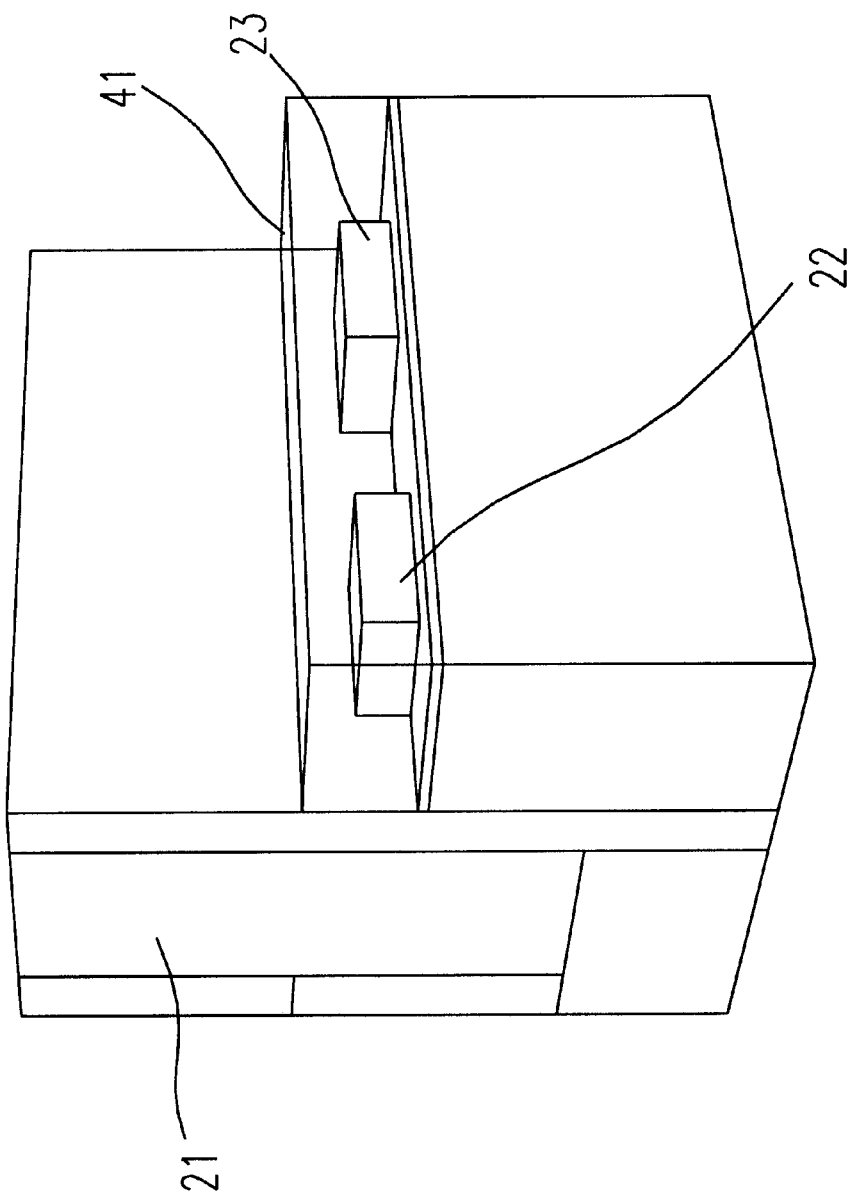
FIG. 6 is a schematic diagram showing a HF vapor etching machine covered by a lid in the present invention.

Further more, there is a lid (41) covering the working platform of the etching machine (21) for protecting every wafer in the cassette (11) as shown in FIG. 6.

Figure 1:
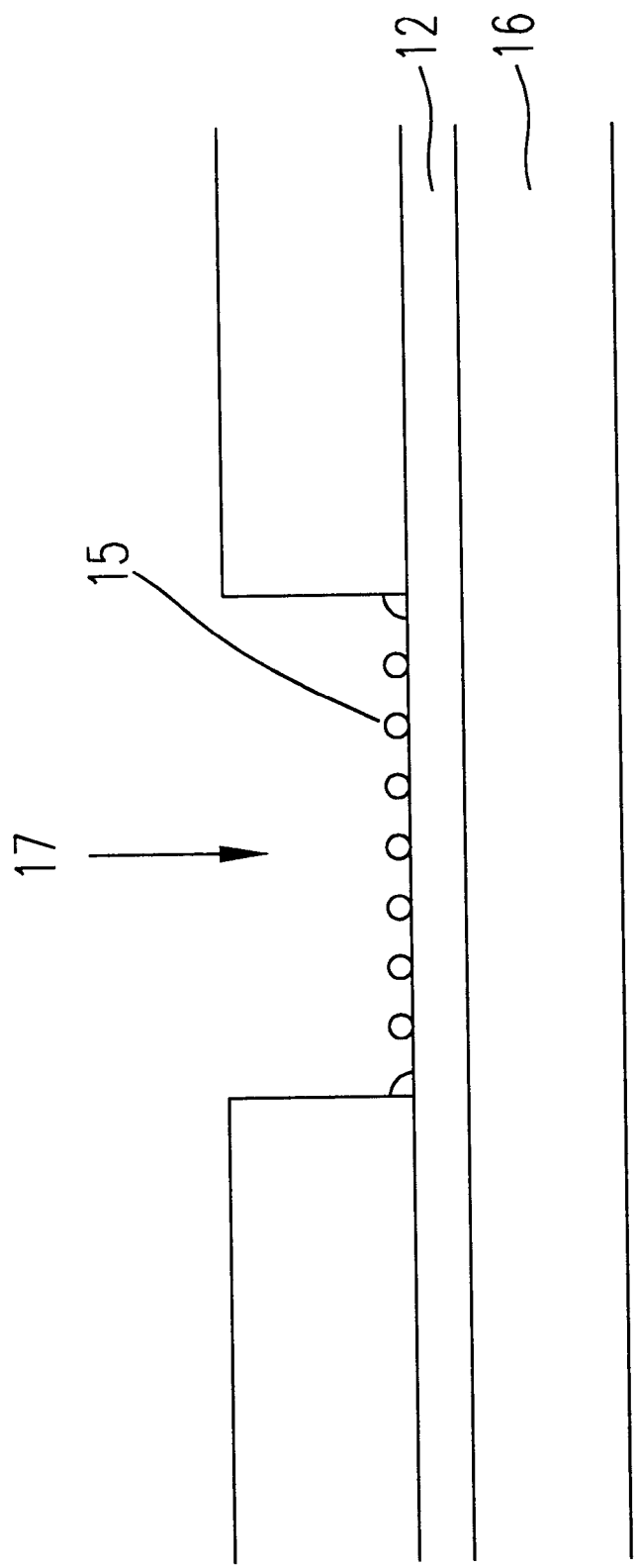
FIG. 1 is a schematic diagram showing a polymeric residue which is etched by a HF vapor.
Figure 2:
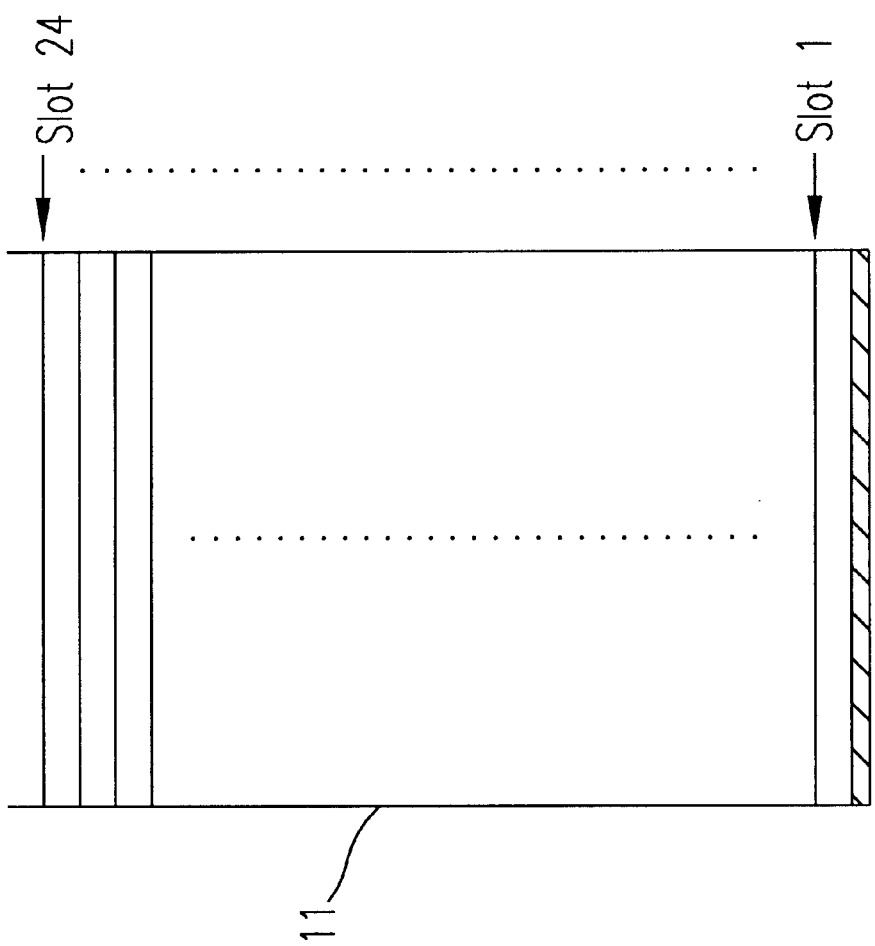
FIG. 2 is a schematic diagram showing a cassette with 24 wafers.
Figure 3:
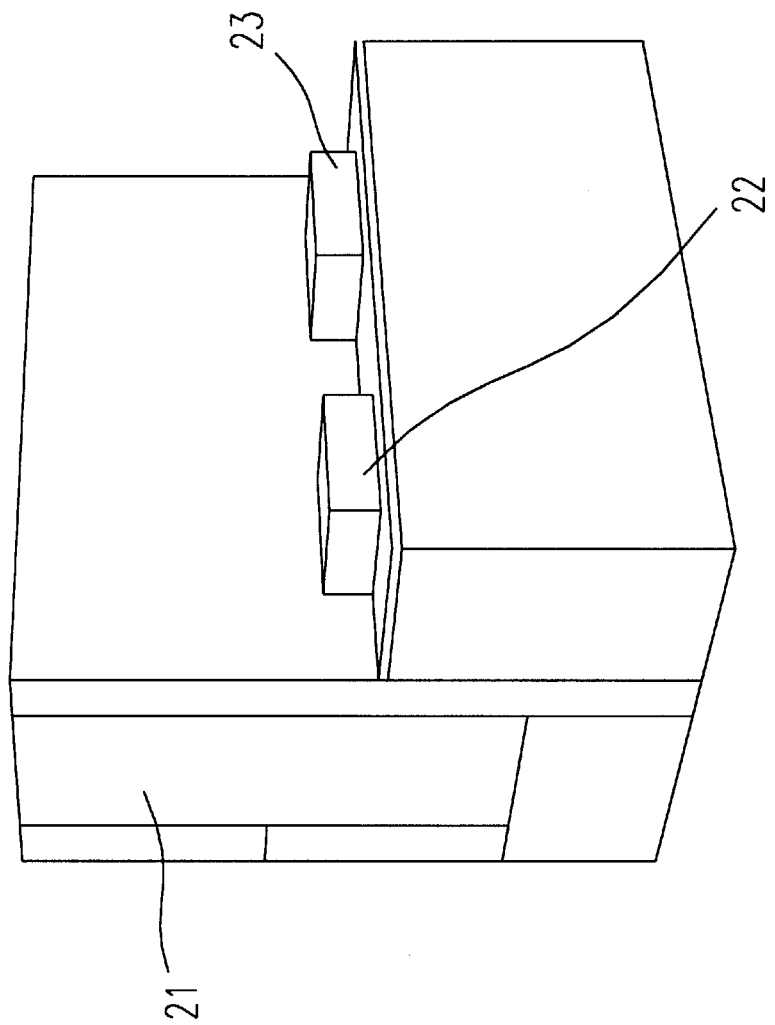
FIG. 3 is a schematic diagram showing a HF vapor etching machine of the prior art.
Figure 4:
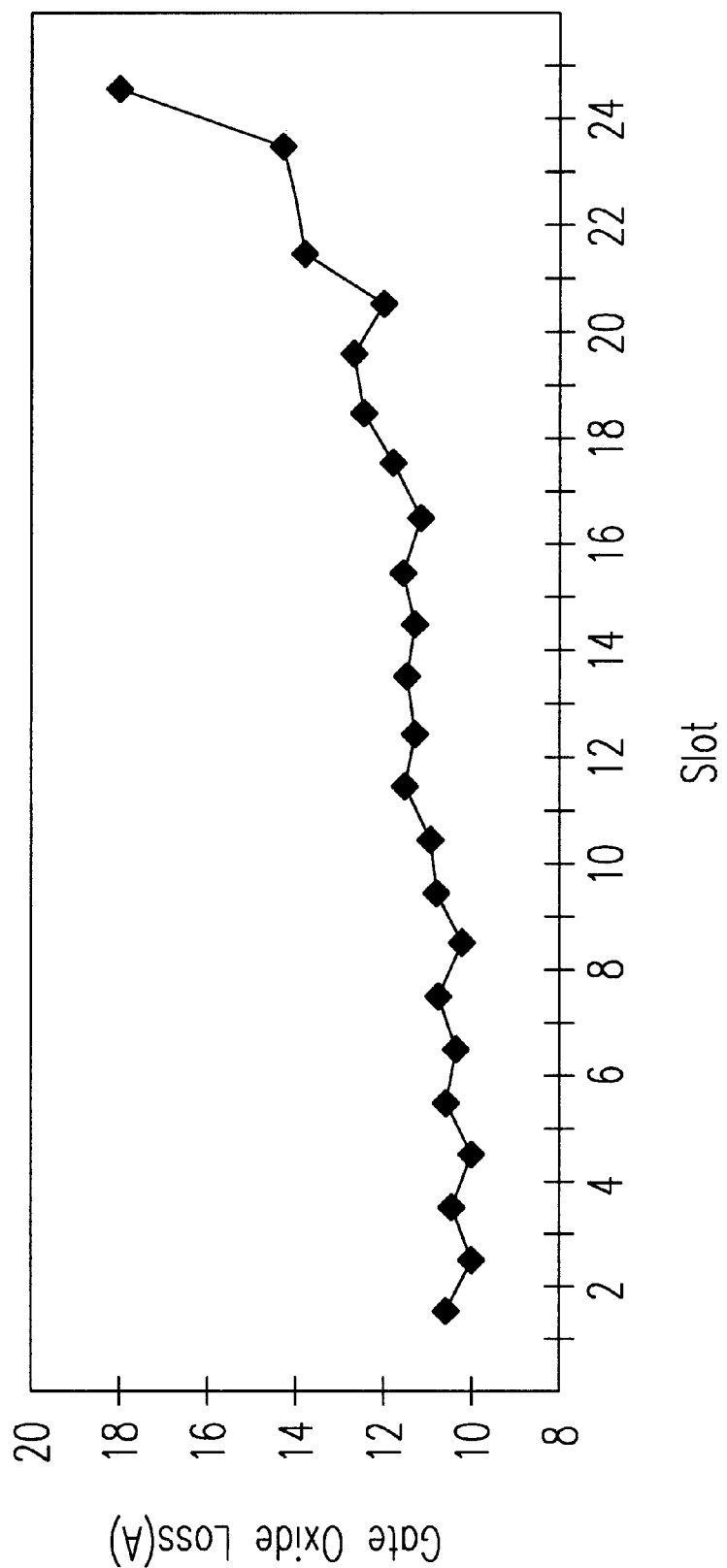
FIG. 4 is a gate oxide loss vs. slot plot according to the prior art.
Figure 7:
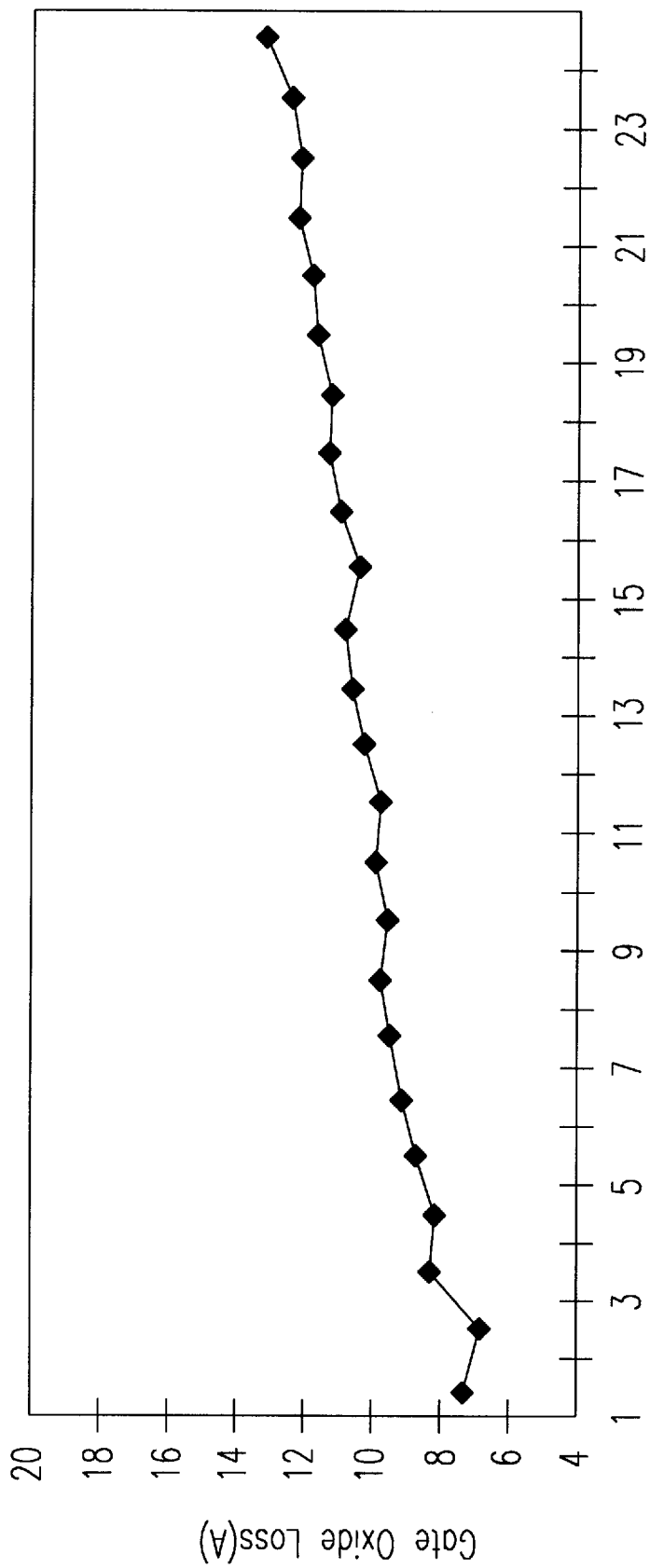
FIG. 7 is a gate oxide loss vs. slot plot of the present invention.

In order to prove that the oxide loss of the wafer on the top of the cassette is reduced, the oxide loss of 24 wafers in 24 slots are measured. As shown in FIG. 7, the oxide loss of the wafer in slot 24 does not increase very much, and the oxide loss of the wafers in other slots are also reduced in comparison with that of the wafer in the slot 24 in FIG. 4.

From the above description, it is obviously to know that the reason why the oxide loss of the wafer in the slot 24 is more serious than others. By adding a dummy wafer in slot 25, the oxide loss of the wafer is reduced. The oxide loss of the wafers in other slots are also reduced by covering a lid over the working platform of the etching machine.

It should be understood that the scope of the present invention is not limited to the particular embodiment disclosed herein as the best mode contemplated for carrying the present invention.

What is claimed is:

1. A method for protecting a work piece in a semiconductor manufacturing process comprising the steps of:

setting a cassette on a working platform of a single-wafer processing machine for mounting therein said work piece;

providing a sheet piece for preventing said work piece in said cassette from being contaminated by moisture; and providing a lid to cover said working platform of said single-wafer processing machine for preventing a contaminant from entering said cassette.

2. The method according to claim 1 wherein said cassette has a plurality of positions for respectively mounting therein a plurality of said work pieces and said sheet piece is mounted in an uppermost one of said positions.

3. The method according to claim 2 wherein said work piece is a wafer and said cassette has 25 slots for respectively mounting therein said work pieces and said sheet piece.

4. The method according to claim 3 wherein said cassette has 24 wafers respectively mounted from a slot 1 to a slot 24 of said 25 slots in said cassette.

5. The method according to claim 3 wherein said sheet piece is mounted in a slot 25 of said 25 slots in said cassette.

6. The method according to claim 5 wherein said sheet piece is a dummy wafer.

7. The method according to claim 3, further comprising a step of subjecting said work piece to a reaction which is a gaseous hydrofluoric acid etching process for removing a polymer on said work piece.

8. The method according to claim 7 wherein said etching process is to etch said work piece in said slot 1 first and to etch said work piece in said slot 24 last.

* * * * *